(12) United States Patent
Kim et al.

(10) Patent No.: US 8,269,238 B2
(45) Date of Patent: Sep. 18, 2012

(54) PHOTONIC CRYSTAL LIGHT EMITTING DEVICE USING PHOTON-RECYCLING

(75) Inventors: Hyun Jun Kim, Gyunggi-do (KR); Chang Hwan Choi, Gyunggi-do (KR); Won Ha Moon, Gyunggi-do (KR); Jong Ho Lee, Seoul (KR); Jae Chul Yong, Gyunggi-do (KR); Jin Ha Kim, Gyunggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 502 days.

(21) Appl. No.: 12/007,495

(22) Filed: Jan. 11, 2008

(65) Prior Publication Data
US 2008/0217639 A1 Sep. 11, 2008

(30) Foreign Application Priority Data
Mar. 5, 2007 (KR) ................ 10-2007-0021432

(51) Int. Cl.
*H01L 33/00* (2010.01)
(52) U.S. Cl. .................. 257/98; 257/E33.067
(58) Field of Classification Search .............. 257/98, 257/E33.067
See application file for complete search history.

(56) References Cited

U.S. PATENT DOCUMENTS

| | | | | |
|---|---|---|---|---|
| 5,955,749 A | * | 9/1999 | Joannopoulos et al. | ........ 257/98 |
| 7,078,736 B2 | | 7/2006 | Lin et al. | |
| 2005/0116625 A1 | * | 6/2005 | Park et al. | ........ 313/504 |
| 2006/0138443 A1 | * | 6/2006 | Fan et al. | ........ 257/100 |
| 2007/0221867 A1 | * | 9/2007 | Beeson et al. | ........ 250/487.1 |

FOREIGN PATENT DOCUMENTS
JP 2006-186348 7/2006
* cited by examiner

*Primary Examiner* — Lynne Gurley
*Assistant Examiner* — Hsin-Yi Hsieh
(74) *Attorney, Agent, or Firm* — McDermott Will & Emery LLP (57) ABSTRACT

A photonic crystal light emitting device including: a light emitting diode (LED) light emitting structure including a first conductive semiconductor layer, a second conductive semiconductor layer, and an active layer interposed between the first and second conductive semiconductor layers; and a first photon-recycling light emitting layer formed on one surface of the first conductive semiconductor layer, opposite to the active layer, wherein the first photon-recycling light emitting layer absorbs a primary light emitted from the LED light emitting structure and emits a light having a different wavelength from that of the primary light, and a photonic crystal structure is formed on an entire thickness of the first photon-recycling light emitting layer.

8 Claims, 9 Drawing Sheets

Prior Art

FIG. 1

Prior Art

Prior Art

PHOTONIC CRYSTAL LIGHT EMITTING DEVICE USING PHOTON-RECYCLING

CROSS-REFERENCE TO RELATED APPLICATIONS

This application claims the priority of Korean Patent Application No. 2007-0021432 filed on Mar. 5, 2007, in the Korean Intellectual Property Office, the disclosure of which is incorporated herein by reference.

BACKGROUND OF THE INVENTION

1. Field of the Invention

The present invention relates to a light emitting device, and more particularly, to a photonic crystal light emitting device with high optical efficiency using photon-recycling.

2. Description of the Related Art

Recently, there is performed a lot of researches on applying a photonic crystal structure as technologies to improve light extraction efficiency of semiconductor light emitting device such as GaN-based light emitting diodes (LEDs). LEDs having a photonic crystal structure may have merits of not only improving light extraction efficiency but also improving internal quantum efficiency and controlling a light emitting direction.

However, due to a dry etching generally used to form a photonic crystal structure, a serious damage occurs in a semiconductor crystal structure for electrical operation. Also, efficient current supply via the photonic crystal structure is another object to be solved by a photonic crystal LED. Now, most of researches on photonic crystal LEDs employ a method of forming a photonic crystal structure, a periodical refractive index modulation structure on only a surface of an LED chip. The photonic crystal LED has an additional structure for efficient current injection. The photonic crystal LED having such a structure is incapable of utilizing intensification of internal quantum efficiency that is one of greatest characteristics of a photonic crystal. Accordingly, it is difficult to provide improvement over conventional corrugated interface surface (CIS) or surface roughness structures.

Figure 1:
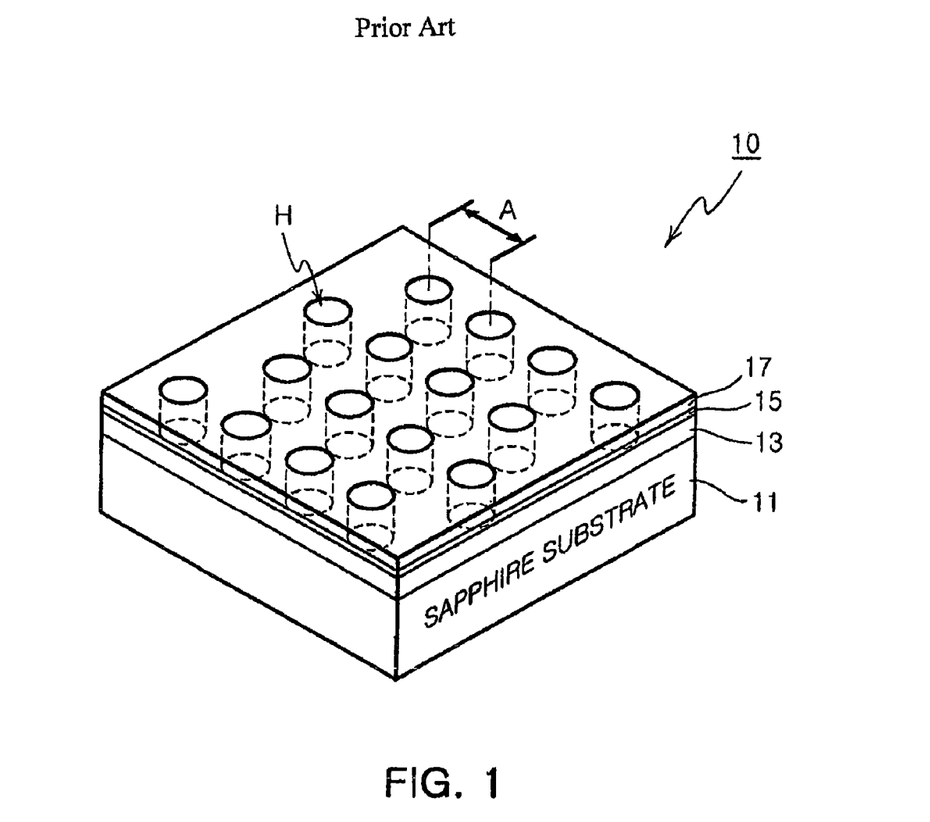
FIG. 1 is a perspective view schematically illustrating a conventional photonic crystal LED.

FIG. 1 is a perspective view schematically illustrating a conventional photonic crystal LED 10. Referring to FIG. 1, the photonic crystal LED 10 includes an n-type GaN layer 13, an active layer 15, and a p-type GaN layer 17, sequentially formed on a sapphire substrate 11. On the n-type GaN layer 13, the active layer 15, and the p-type GaN layer 17, there are arranged holes H with a smaller size than that of a light wavelength in a two-dimensional periodical structure with an interval A to a degree of the light wavelength, to form a photonic crystal structure. The photonic crystal LED 10 has functions of not only improving light extraction efficiency but also improving a light yield and controlling a light emission direction. Also, it has been considered that problems such as a reduction of an active layer area due to the holes H of a periodical arrangement and a surface recombination are eased by an effect of improving internal efficiency due to a photonic crystal structure or a passivation process.

However, this is a conclusion without fully considering that an LED is electrically driven. For example, to improve the light yield, the holes H should be formed to a depth of an area including the active layer 15. Due to a dry etching generally used to form the holes H having the depth, particularly, inductive coupling plasma reactive ion etching (ICPRIE), a serious damage occurs in a semiconductor crystal structure for electrical operations, particularly, a crystal structure around an active layer. Particularly, an n-type donor occurs in a p-doped portion and reduces a doping concentration of the p-type semiconductor layer 17. This phenomenon not only partially occurs but also is longitudinally and laterally spread. Due to this, a semiconductor LED may lose functions of an electrically driven device. Accordingly, most of current researches on photonic crystal light emitting devices employ a method of forming a photonic crystal structure on a surface of a chip, such as a shallow photonic crystal.

Figure 2A:
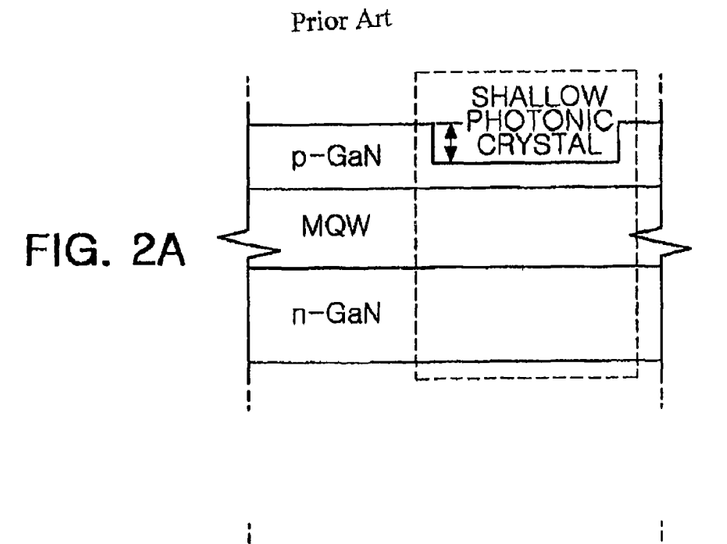
FIGS. 2A to 2C are partial cross-sectional views illustrating various conventional photonic crystal structures.
Figure 2B:
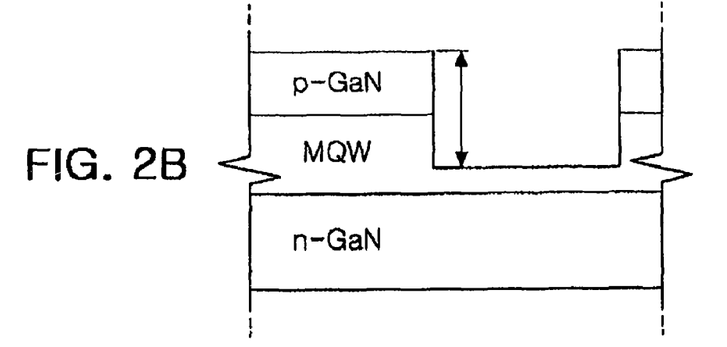
Figure 2C:
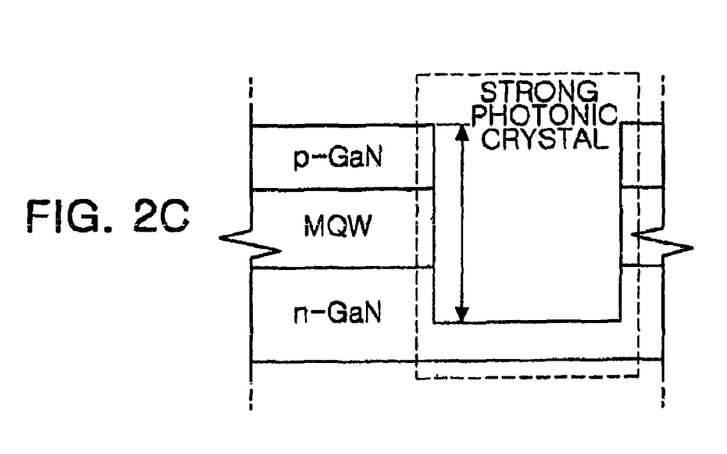

FIGS. 2A to 2C are partial cross-sectional views illustrating various conventional photonic crystal structures. As shown in FIG. 2A, the shallow photonic crystal where a depth of an element of a photonic crystal, such as a hole and a post, is below an active layer or a multi-quantum well (MQW) may be used to improve light extraction efficiency. A photonic crystal where a depth or height of an element thereof reaches an active layer or a light emitting layer as shown in FIG. 2B or a strong photonic crystal where an element thereof perfectly penetrates an active layer or a light emitting layer as shown in FIG. 2C may be used. However, the shallow photonic crystal of FIG. 2A does not fully use an effect of strengthening a light yield and the photonic crystals of FIGS. 2B and 2C cause great damages in a semiconductor crystal required for electric drive (refer to FIG. 1).

Another problem of a photonic crystal is present in efficiently injecting a current. Since forming a photonic crystal structure accompanies a partial removal of a current injection path, it is considerably difficult to embody relatively uniform current distribution. Nonuniformity of current distribution has a bad effect on current injection efficiency and decreases internal efficiency of an entire LED. To solve the problem, a transparent metal electrode conformally covering an almost entire of the photonic crystal structure may be used.

Figure 3:
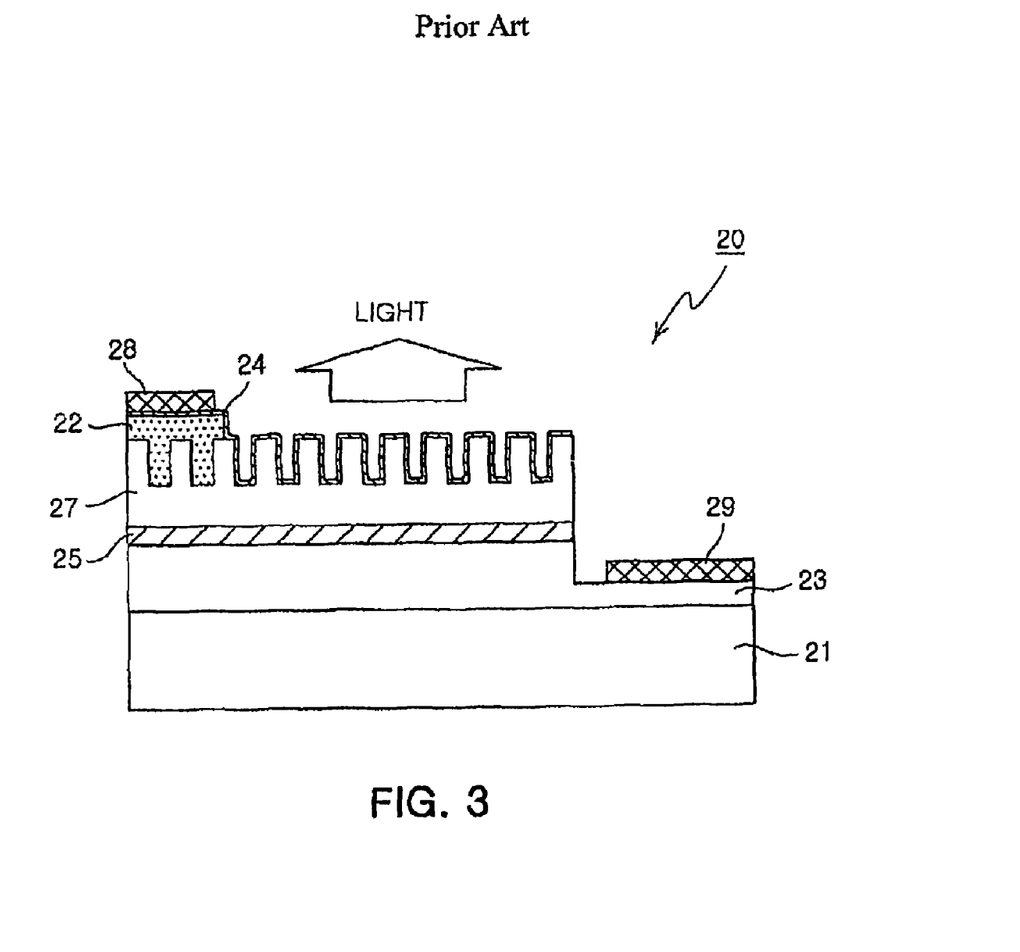
FIG. 3 is a cross-sectional view illustrating another conventional photonic crystal light emitting device.

FIG. 3 is a cross-sectional view illustrating another conventional photonic crystal LED 20. Referring to FIG. 3, an n-type semiconductor layer 23, an active layer 25, and a p-type semiconductor layer 27 are sequentially laminated on a sapphire substrate 21, and an n-side electrode 29 is formed on the n-type semiconductor layer 23. A shallow photonic crystal structure is formed on a surface of the p-type semiconductor layer 27. To improve lateral current spreading, a thin transparent metal electrode layer 24 conformally covers almost the photonic crystal structure. Just below a p-bonding electrode 28 in contact with the transparent metal electrode layer 24, an insulation body 22 is disposed between a photonic crystal and the transparent metal electrode layer 24 to restrain a current concentration near the p-bonding electrode 28. However, since the photonic crystal LED 20 has the shallow photonic crystal structure, as described above, the effect of increasing a light yield is not fully used. Accordingly, there is obtained little effect over conventional corrugated interface surface (CIS) or surface roughness structures.

SUMMARY OF THE INVENTION

An aspect of the present invention provides a photonic crystal light emitting device capable of more fully using merits of a photonic crystal structure such as light extraction efficiency, a light yield, and a light directivity, regardless of damages in a semiconductor crystal structure for electrical operation, the damages due to a dry etching.

An aspect of the present invention also provides a photonic crystal light emitting device with improved light extraction efficiency, a light yield, and a light directivity, the device capable of outputting various colors including a white light, a multicolor light, and a mixed color by using a single chip structure using photon-recycling.

According to an aspect of the present invention, there is provided a photonic crystal light emitting device including: a light emitting diode (LED) light emitting structure including a first conductive semiconductor layer, a second conductive semiconductor layer, and an active layer interposed between the first and second conductive semiconductor layers; and a first photon-recycling light emitting layer formed on one surface of the first conductive semiconductor layer, opposite to the active layer, wherein the first photon-recycling light emitting layer absorbs a primary light emitted from the LED light emitting structure and emits a light having a different wavelength from that of the primary light, and a photonic crystal structure is formed on an entire thickness of the first photon-recycling light emitting layer.

The first conductive semiconductor layer may have an n-type conductivity, and the second conductive semiconductor layer may have a p-type conductivity. The first and second conductive semiconductor layers and the active layer may be formed of a nitride semiconductor. The first photon-recycling light emitting layer may be formed of a semiconductor material.

The photonic crystal light emitting device may further include a transparent substrate disposed between the first photon-recycling light emitting layer and the first conductive semiconductor layer.

The LED light emitting structure may be formed in a mesa structure to expose a portion of the first conductive semiconductor layer, and an n-side electrode may be formed on the exposed portion of the first conductive semiconductor layer.

The photonic crystal light emitting device may be mounted on a submount in such a way that the second conductive semiconductor layer faces the submount and the first photon-recycling light emitting layer faces the opposite of the submount, and a light may be outputted to one surface of the first photon-recycling light emitting layer, the one surface opposite to the active layer. In this case, the photonic crystal light emitting device may further include a reflective metal layer formed on one surface of the second conductive semiconductor layer, the one surface opposite to the active layer.

The photonic crystal light emitting device may further include a second photon-recycling light emitting layer formed on one surface of the first photon-recycling light emitting layer, the one surface opposite to the first conductive semiconductor layer. The second photon-recycling light emitting layer may absorb a secondary light emitted from the first photon-recycling light emitting layer and emit a light having a different wavelength from that of the secondary light, and a photonic crystal structure may be formed on an entire thickness of the second photon-recycling light emitting layer. Also, the photonic crystal light emitting device may further include a transparent substrate formed between the first photon-recycling light emitting layer and the second photon-recycling light emitting layer.

The photonic crystal light emitting device may output a white light. The active layer may emit a blue light and the first photon-recycling light emitting layer may emit a yellow light. On the other hand, the active layer may emit a blue light, the first photon-recycling light emitting layer may emit a green light, and the second photon-recycling light emitting layer may emit a red light.

The photonic crystal structure may be formed of a periodical pattern of holes. On the other hand, the photonic crystal structure may be formed of a periodical pattern of posts.

According to another aspect of the present invention, there is provided a photonic crystal light emitting device including: an LED light emitting structure where a first conductive semiconductor layer, an active layer, and a second conductive semiconductor layer are sequentially formed; and n number of photon-recycling light emitting layers sequentially disposed on one surface of the first conductive semiconductor layer, the one surface opposite to the active layer, wherein the respective photon-recycling light emitting layers have a photonic crystal structure with a two-dimensional periodical pattern of elements formed over an entire thickness thereof. A photon-recycling light emitting layer firstly disposed from the first conductive semiconductor layer absorbs a light emitted from the active layer and emits a light having a different wavelength from that of the absorbed light. A photon-recycling light emitting layer mth disposed from the first conductive semiconductor layer, m is an integer of 2 or more, absorbs a light emitted from a photon-recycling light emitting layer m−1th disposed and emits a light having a different wavelength from that of the absorbed light.

Through the present specification, "III group nitride semiconductor, in short, called as "nitride semiconductor" designates one of binary, ternary, and quaternary compound semiconductors expressed as $Al_xGa_yIn_{1-x-y}N$ ($0 \leq x \leq 1$, $0 \leq y \leq 1$, $0 \leq x+y \leq 1$).

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings. The invention may however be embodied in many different forms and should not be construed as limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals are used throughout to designate the same or similar components.

Figure 4:
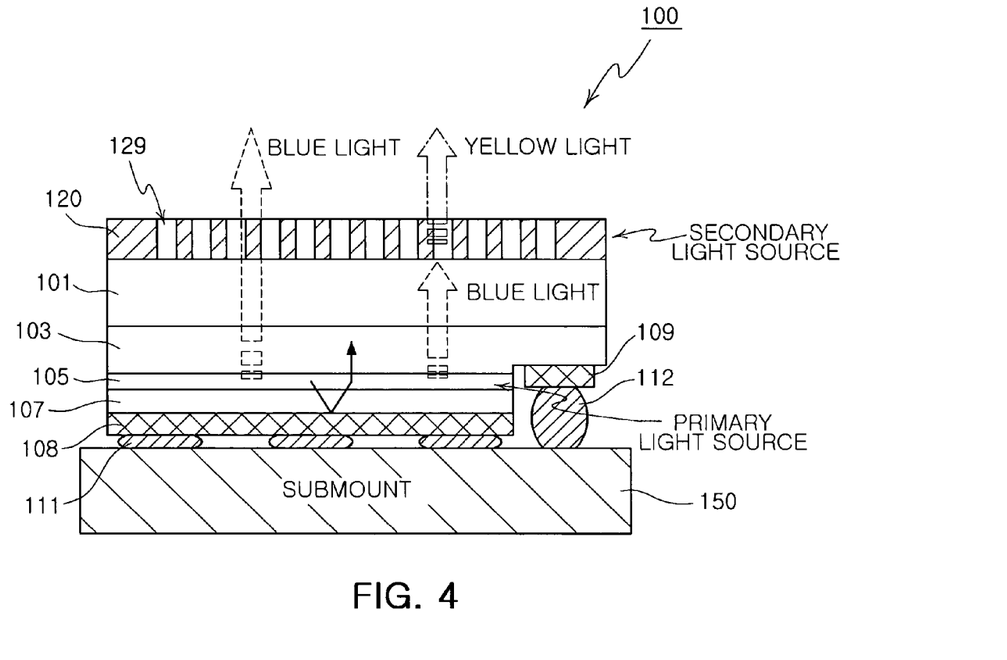
FIG. 4 is a cross-sectional view illustrating a photonic crystal light emitting device according to an embodiment of the present invention.

FIG. 4 is across-sectional view illustrating a photonic crystal light emitting device 100 according to an embodiment of the present invention. FIG. 4, particularly, illustrates the photonic crystal light emitting device 100 having a flip-chip structure where a chip is mounted on an Si submount 150 while turned upside down in such a way that a transparent sapphire substrate 101 faces upward.

Referring to FIG. 4, the photonic crystal light emitting device 100 includes a light emitting diode (LED) light emitting structure of GaN-based semiconductor layers, the transparent sapphire substrate 101, and a photon-recycling light emitting layer 120. The LED light emitting structure includes an n-type GaN layer 103, a p-type GaN layer 107, and an active layer 105 having one of an single-quantum well InGaN structure and a multi-quantum well InGaN structure interposed therebetween and has a mesa structure where a portion of the n-type GaN layer 103 is exposed. On the exposed portion of the n-type GaN layer 103, an n-side electrode 109 is disposed. On the p-type GaN layer, that is, on one surface of the p-type GaN layer, opposite to the active layer 105, a reflective metal layer 108 such as Ag is disposed as a p-contact electrode. Respective electrodes such as the reflective metal layer 108 and the n-side electrode 109 of the photonic crystal light emitting device 100 are connected to the Si submount 150 via connection elements 111 and 112 such as a bump and solder. The photonic crystal light emitting device 100 outputs a light to the first photon-recycling light emitting layer 20 opposite to the active layer 105.

On one surface of the substrate 101 opposite to the active layer 105, the photon-recycling light emitting layer 120 having a perfect photonic crystal structure is additionally formed. The photon-recycling light emitting layer 120 is a light emitting area capable of operating regardless of electric drive and corresponds to a certain wavelength conversion layer regenerating photons by optical pumping of an incident light. That is, the photon-recycling light emitting layer 120 absorbs a light from the active layer 105, for example, a blue light, and emits a light having a different, longer, wavelength from that of the absorbed light.

For example, when the active layer 105 of InGaN emits a blue light, a portion of the blue light may penetrate the photon-recycling light emitting layer 120 of AlGaInP and another portion thereof may be absorbed by the photon-recycling light emitting layer 120 to emit a light having a long wavelength such as a yellow light. The blue light penetrating the photon-recycling light emitting layer 120 is mixed with the yellow light emitted from the photon-recycling light emitting layer 120, thereby outputting a white light. As described above, the photon-recycling light emitting layer 120 is a certain passive element operated by optical pumping of a primary light source. In this case, the active layer 105 is the primary light source and the photon-recycling light emitting layer 120 is a secondary light source.

Also, through an entire thickness of the photon-recycling light emitting layer 120, elements of a photonic crystal, such as holes and posts forming a periodical pattern in a two-dimensional arrangement are formed. As shown in FIG. 4, in the photon-recycling light emitting layer 120, open areas 129 forming a "strong" photonic crystal are periodically arranged. The open area 129 may be a hole "perfectly" penetrating the photon-recycling light emitting layer 120 (refer to FIG. 9A) and may be an open space between posts forming the photon-recycling light emitting layer 120 (refer to FIG. 9B).

As described above, since the photon-recycling light emitting layer 120 is a passive element operating regardless of electric drive, the "strong" photonic crystal structure may be formed over the entire thickness of the photon-recycling light emitting layer 120, in which there is no damage in a semiconductor crystal for electric drive. Accordingly, all merits of improving light extraction efficiency and a light yield are fully used. Also, the photon-recycling light emitting layer 120 increases light extraction efficiency with respect to the blue light by proving an effect such as surface roughness, to the blue light extraction. Entire light efficiency of the photonic crystal light emitting device 100 may be notably increased. In addition, a light reflection of the reflective metal layer 108 toward the photon-recycling light emitting layer 120 allows the light extraction efficiency to be more increased.

Though an LED light emitting structure formed of a nitride semiconductor and a photon-recycling light emitting layer of AlGaInP are used in the present embodiment, the present invention is not limited thereto and other semiconductor materials or other compositions may be used to a primary light and a secondary light having different wavelengths. Also, in addition to the sapphire substrate, the transparent substrate 101 may be formed of other transparent substrate such as a GaAs substrate and a GaN substrate. Also, the photonic crystal light emitting device 100 may be used to output not only a white light but also various color lights obtained by mixing colors such as pink, orange, and light green.

Figure 5:
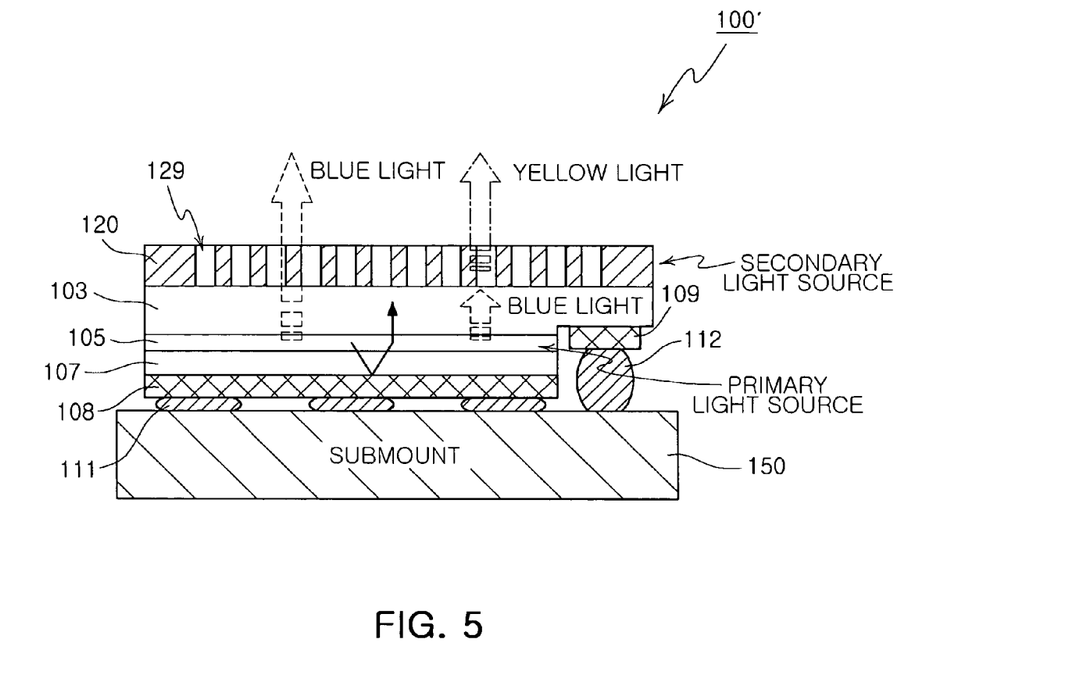
FIG. 5 is a cross-sectional view illustrating a photonic crystal light emitting device according to another embodiment of the present invention.

FIG. 5 is a cross-sectional view illustrating a photonic crystal light emitting device 100' according to another embodiment of the present invention. The photonic crystal light emitting device 100' has a structure where the transparent substrate 101 is emitted from the photonic crystal light emitting device 100 of FIG. 4. For example, after an LED light emitting structure is grown from a sapphire substrate, the sapphire substrate may be removed by laser lift-off, grinding, and etching. In this case, there may be obtained an effect of reducing a light absorption (a light loss) caused by the transparent substrate, in addition to the merits of improving a light yield and light extraction efficiency.

Figure 6:
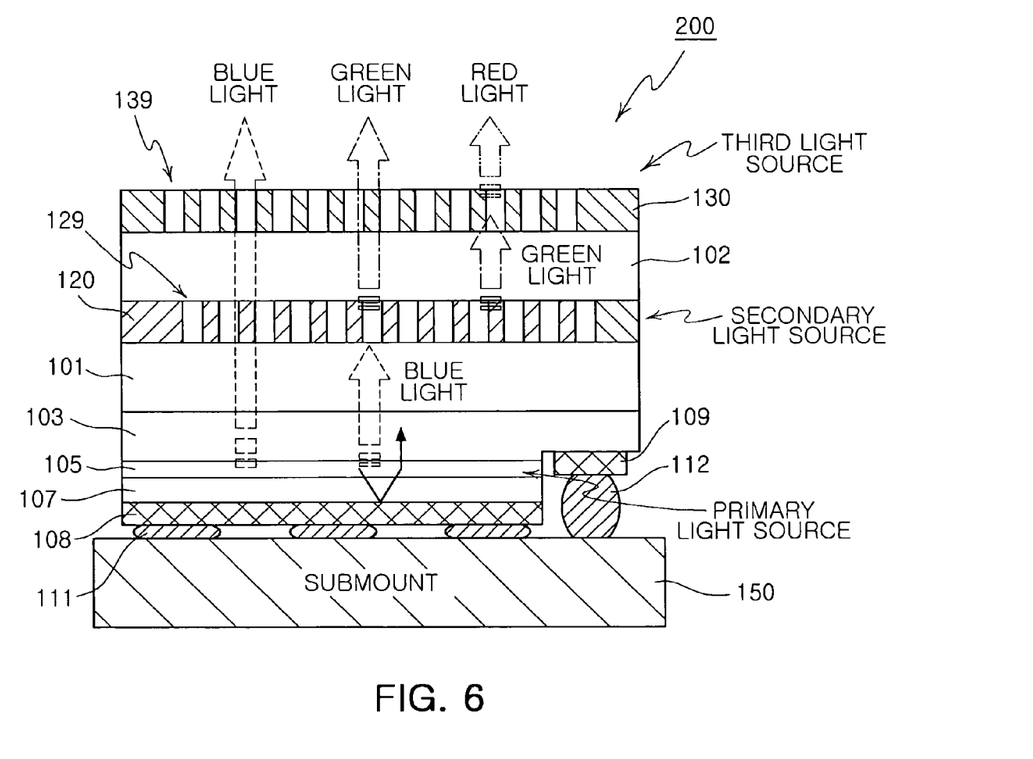
FIG. 6 is a cross-sectional view illustrating a photonic crystal light emitting device according to still another embodiment of the present invention.

FIG. 6 is a cross-sectional view illustrating a photonic crystal light emitting device 200 according to still another embodiment of the present invention. The photonic crystal light emitting device 200 further includes an additional transparent substrate 102 and an additional second photon-recycling light emitting layer 130, formed on one surface of a first photon-recycling light emitting layer 120', that is, opposite to the n-type GaN layer 103. The second photon-recycling light emitting layer 130 has a photonic crystal structure formed through an entire thickness thereof. Accordingly, a depth of an open area 139 corresponds to the thickness of the second photon-recycling light emitting layer 130 (strong photonic crystal).

Referring to FIG. 6, from the n-type semiconductor layer 103, the first photon-recycling light emitting layer 120' and the second photon-recycling light emitting layer 130 are sequentially disposed. In the first photon-recycling light emitting layer 120', open areas 129' forming a "strong" photonic crystal are periodically arranged. The first photon-recycling light emitting layer 120' may absorb a light emitted from the active layer 105 of InGaN and emit a green light having a longer wavelength than that of the absorbed light. The second photon-recycling light emitting layer 130 may absorb a portion of the green light emitted from the first photon-recycling light emitting layer 120' and emit a red light having a longer wavelength than that of the green light. The second photon-recycling light emitting layer 130 may absorb a portion of not only the green light but also a blue light.

The blue light and green light penetrating the respective layers are mixed with the red light emitted from the photon-recycling light emitting layer 130, thereby outputting a white light. For example, the first photon-recycling light emitting layer 120' may be formed of one of an InGaN semiconductor different from the InGaN composition of the active layer 105 and an AlGaInN semiconductor excited by the blue light and emitting the green light. Also, the second photon-recycling light emitting layer 130 may be formed of one of AlGaAs, AlGaP, and AlGaInP, excited by the one of the green light and blue light and emitting the red light. In this case, the active layer 105 is a primary light source, an active element, and the first and second photo-recycling light emitting layers 120' and 130 are a secondary light source and a third light source, passive elements, respectively.

In the present embodiment, since the respective photon-recycling light emitting layers 120' and 130 are operated by optical pumping instead of electric drive and the photonic crystal structure formed through the entire thicknesses thereof, a light yield and light extraction efficiency may be improved and far-field beam distribution may be controlled. In addition, there may be provided high light extraction efficiency with respect to a light in addition to lights emitted from the photon-recycling light emitting layers 120' and 130, for example, the light from the active layer 105. Also, a white light with a higher color rendering index (CRI) may be embodied by mixing lights of various wavelength bands.

Figure 7:
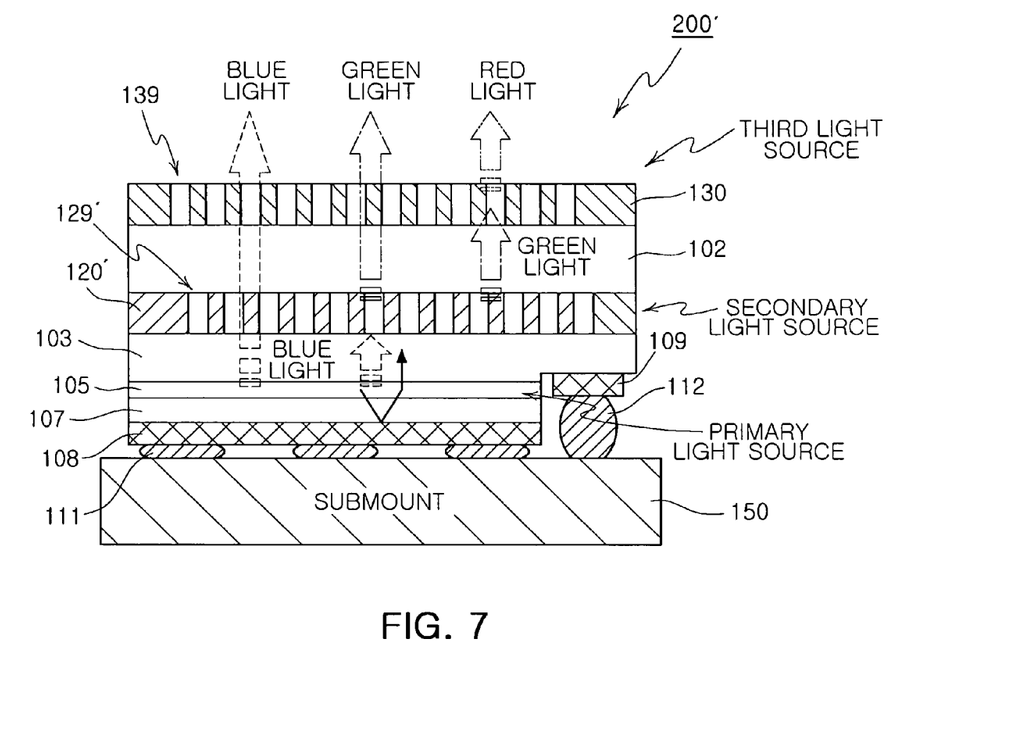
FIG. 7 is a cross-sectional view illustrating a photonic crystal light emitting device according to yet another embodiment of the present invention.
Figure 8:
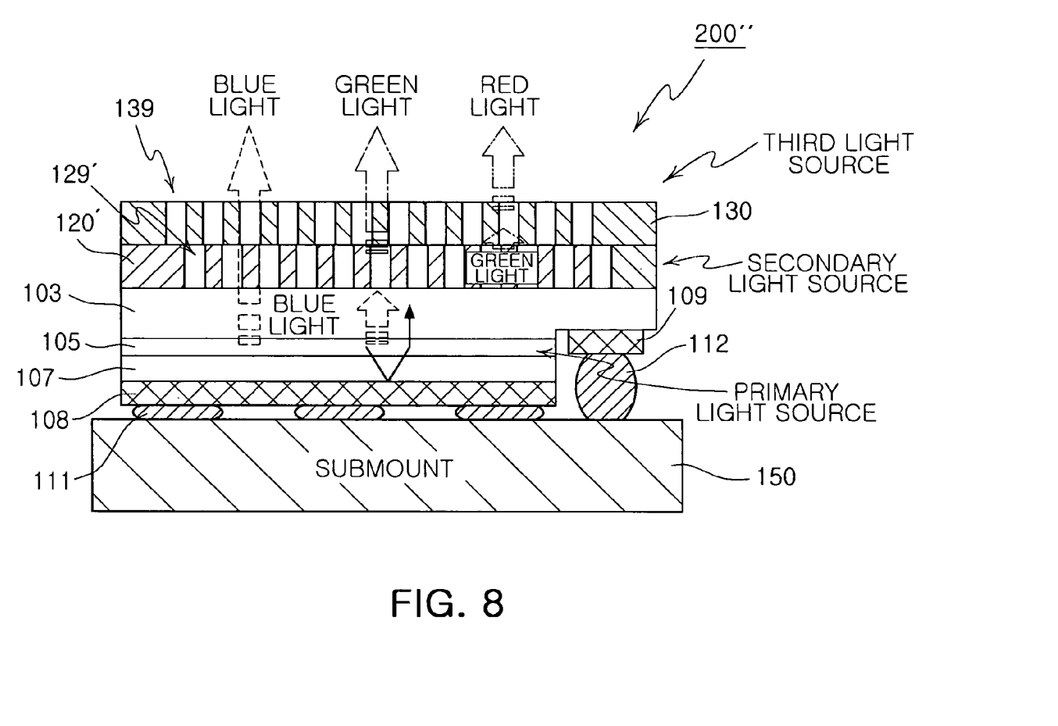
FIG. 8 is a cross-sectional view illustrating a photonic crystal light emitting device according to a further embodiment of the present invention.

FIGS. 7 and 8 are cross-sectional views illustrating photonic crystal light emitting devices 200' and 200" corresponding to varied examples of the photonic crystal light emitting device 200 of FIG. 6. The photonic crystal light emitting device 200' of FIG. 7 corresponds to a structure where the transparent substrate 101 is removed from the structure of the photonic crystal light emitting device 200 of FIG. 6. Also, the photonic crystal light emitting device 200" of FIG. 8 corresponds to a structure where all of the transparent substrate 101 and the additional transparent substrate 102 are removed from the structure of the photonic crystal light emitting device 200 of FIG. 6. As described above, one or more of the transparent substrates 101 and 102 are removed, thereby reducing a light loss caused by a transparent substrate.

Figure 9A:
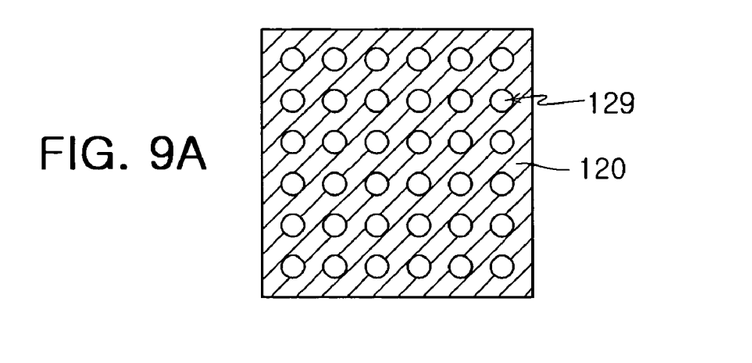
FIGS. 9A to 9D are top views illustrating examples of a periodical lattice structure forming a photonic crystal.
Figure 9B:
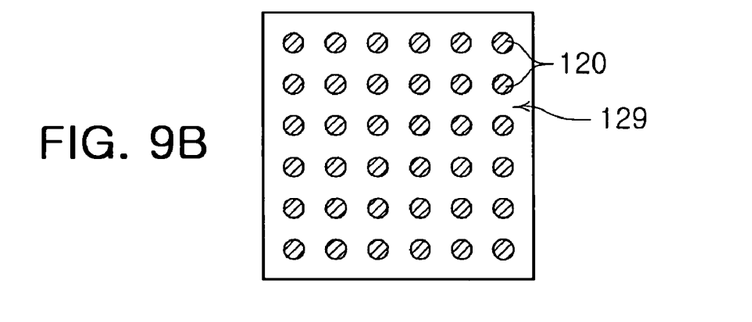
Figure 9C:
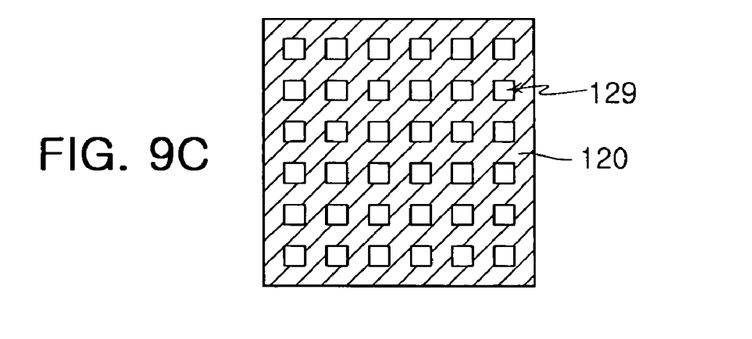
Figure 9D:
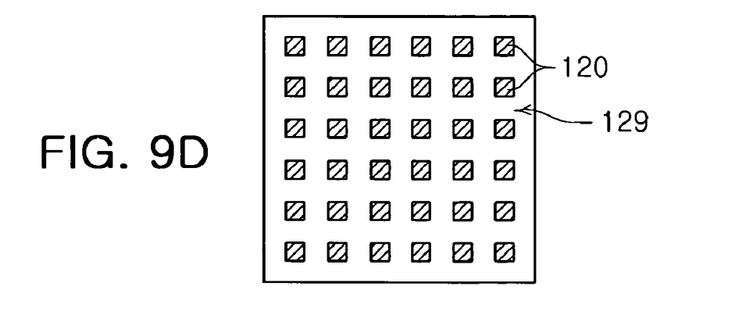

FIGS. 9A to 9D are top views illustrating examples of a periodical lattice structure forming a photonic crystal, the structure capable of being employed in the present invention. The open area 129 of the photon-recycling light emitting layer 120 may be one of a hole as shown in FIGS. 9A and 9C and a post as shown in FIGS. 9B and 9D. Also, the hole or post may be one of a circle as shown in FIGS. 9A and 9B and a square as shown in FIGS. 9C and 9D. A two-dimensional periodical pattern of the holes and the posts forms a photonic crystal providing the various optical effects as described above. In addition, photonic crystal structures in various forms may be employed. Also, the shape of a two-dimensional lattice formed by the holes and posts may be variously selected, as not only a lattice in the shape of a square matrix but also a triangular lattice (refer to FIG. 1).

Though a number of photon-recycling light emitting layers is two or less in the present embodiment, the present invention is not limited thereto. For example, n number of photon-recycling light emitting layers (n is an integer of 1 or more) may be sequentially disposed on one surface of an n-type semiconductor opposite to an active layer. The respective photon-recycling light emitting layers may have a photonic crystal structure with a two-dimensional periodical pattern of elements such as holes and posts formed through an entire thickness of each of the photon-recycling light emitting layers. A photon-recycling light emitting layer firstly disposed from the n-type semiconductor may absorb a light emitted from the active layer and emit a light having a different wavelength from that of the absorbed light. Also, a photon-recycling light emitting layer mth disposed from the n-type semiconductor may absorb a light emitted from a photon-recycling light emitting layer m−1th disposed and emit a light having a different wavelength from that of the absorbed light (m is an integer of 2 or more).

As described above, since including a photonic crystal structure formed through an entire depth of a photon-recycling light emitting layer, merits of a photonic crystal, such as improving a light yield and light extraction efficiency and controlling far-field beam distribution, may be fully used and entire light efficiency of a light emitting device may be greatly improved. In addition, regardless of damages in a semiconductor crystal structure for electrical operation, the damages due to a dry etching, a semiconductor light emitting device with high reliability, high quality, and high efficiency may be easily embodied. A white light with a high CRI may be embodied by mixing lights of various wavelengths using multiple photon-recycling light emitting layers.

While the present invention has been shown and described in connection with the exemplary embodiments, it will be apparent to those skilled in the art that modifications and variations can be made without departing from the spirit and scope of the invention as defined by the appended claims.

What is claimed is:

1. A photonic crystal light emitting device comprising:
   a light emitting diode (LED) light emitting structure including a first conductive semiconductor layer, a second conductive semiconductor layer, and an active layer interposed between the first and second conductive semiconductor layers;
   a first photon-recycling light emitting layer formed on one surface of the first conductive semiconductor layer, opposite to an interface between the first conductive semiconductor layer and the active layer; and
   a transparent substrate disposed between the first photon-recycling light emitting layer and the first conductive semiconductor layer,
   wherein the first photon-recycling light emitting layer has a photonic crystal structure, which absorbs a primary light emitted from the LED light emitting structure and emits a light having a different wavelength from a wavelength of the primary light,
   wherein the photonic crystal structure includes a periodic pattern of semiconductor posts extending across an entire thickness of the first photon-recycling light emitting layer from a top surface of the first photon-recycling light emitting layer to a bottom surface of the first photon-recycling light emitting layer,
   the photonic crystal structure is comprised of an AlGaInP semiconductor, and
   the light emitted by the photonic crystal structure of the AlGaInP semiconductor and having the different wavelength from the wavelength of the primary light is yellow.

2. The photonic crystal light emitting device of claim 1, wherein a conductivity of the first conductive semiconductor layer is an n-type and a conductivity of the second conductive semiconductor layer is a p-type.

3. The photonic crystal light emitting device of claim 1, wherein the first and second conductive semiconductor layers and the active layer are formed of a nitride semiconductor.

4. The photonic crystal light emitting device of claim 1, wherein the LED light emitting structure is formed in a mesa structure to expose a portion of the first conductive semiconductor layer to an outer space, and an n-side electrode is formed on the exposed portion of the first conductive semiconductor layer.

5. The photonic crystal light emitting device of claim 1, wherein the photonic crystal light emitting device is mounted on a submount in such a way that the second conductive semiconductor layer faces the submount and the first photon-recycling light emitting layer faces in the opposite direction to the submount, and a light is outputted to one surface of the first photon-recycling light emitting layer opposed to an interface between the second conductive semiconductor layer and the active layer.

6. The photonic crystal light emitting device of claim 5, further comprising a reflective metal layer formed on one surface of the second conductive semiconductor layer opposed to an interface between the second conductive semiconductor layer and the active layer.

7. The photonic crystal light emitting device of claim 1, wherein the photonic crystal light emitting device outputs a white light.

8. The photonic crystal light emitting device of claim 1, wherein the active layer emits a blue light and the first photon-recycling light emitting layer emits a yellow light.

* * * * *